(12) United States Patent
Charagulla et al.

(10) Patent No.: US 7,282,973 B1
(45) Date of Patent: Oct. 16, 2007

(54) ENHANCED DLL PHASE OUTPUT SCHEME

(75) Inventors: Sanjay K. Charagulla, San Jose, CA (US); Ali H. Burney, Fremont, CA (US)

(73) Assignee: Altera Corporation, San Jose, CA (US)

( * ) Notice: Subject to any disclaimer, the term of this patent is extended or adjusted under 35 U.S.C. 154(b) by 131 days.

(21) Appl. No.: 11/297,040

(22) Filed: Dec. 7, 2005

(51) Int. Cl.
*H03L 7/06* (2006.01)

(52) U.S. Cl. .................. 327/158; 327/159; 327/161

(58) Field of Classification Search ............... None
See application file for complete search history.

(56) References Cited

U.S. PATENT DOCUMENTS

| | | | | |
|---|---|---|---|---|
| 5,801,562 A | * | 9/1998 | Fujii | 327/149 |
| 5,838,205 A | * | 11/1998 | Ferraiolo et al. | 331/2 |
| 6,741,109 B1 | * | 5/2004 | Huang et al. | 327/156 |
| 7,157,949 B2 | * | 1/2007 | Chen et al. | 327/158 |
| 7,199,625 B1 | * | 4/2007 | Chung | 327/149 |
| 2001/0052804 A1 | * | 12/2001 | Hasegawa | 327/156 |
| 2002/0061088 A1 | * | 5/2002 | Kon | 375/376 |

FOREIGN PATENT DOCUMENTS

JP 2004355081 A * 12/2004

* cited by examiner

*Primary Examiner*—Tuan T. Lam
*Assistant Examiner*—William Hernandez
(74) *Attorney, Agent, or Firm*—Townsend and Townsend and Crew LLP

(57) ABSTRACT

A method and system using a delay-locked loop (DLL) to provide multiple phase locked outputs in discrete phase intervals is disclosed. In one embodiment, a reference clock signal is transmitted through a delay chain having a plurality of delay elements. The delay chain is capable of generating a plurality of output clock signals from the reference clock signal. Each of the output clock signals are delayed in discrete phase shift intervals with respect the delay elements. A first of the output clock signals and the reference clock signal are coupled to a first phase comparator capable of forming a first DLL with the delay chain. A second of the output clock signals and the reference clock signal are coupled to a second phase comparator capable of forming a second DLL with the delay chain. The output clock signal from the first DLL or the second DLL may be programmatically selected.

21 Claims, 8 Drawing Sheets

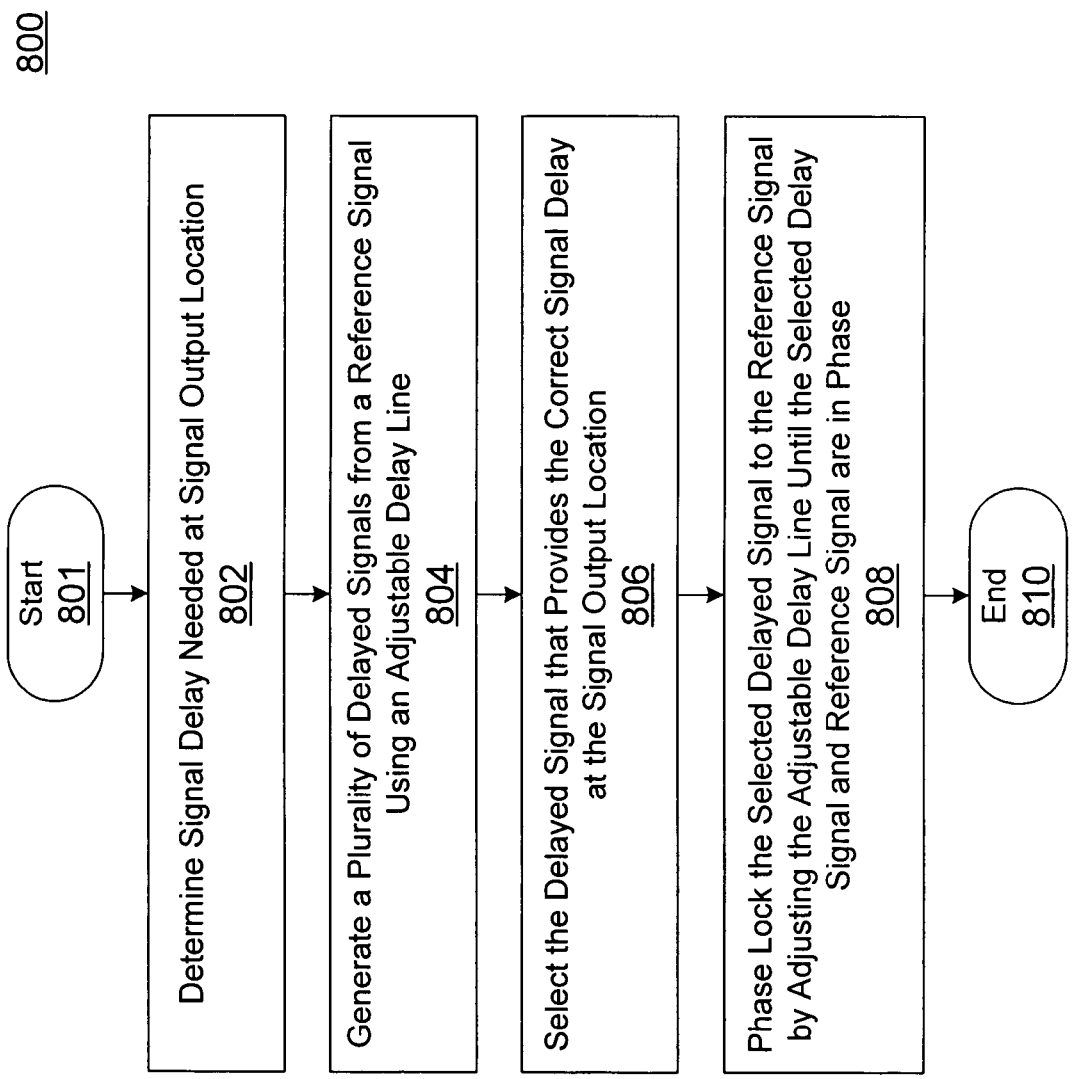

ENHANCED DLL PHASE OUTPUT SCHEME

BACKGROUND

The present invention relates to techniques and circuits for providing a plurality of clock signals to a programmable logic device, and more particularly, providing clock signals that are adjustable in phase relative to an input clock signal.

Generally, programmable logic devices (PLD) such as field programmable gate arrays (FPGA), include thousands of programmable logic cells that use combinations of logic gates and/or look-up tables (LUTs) to perform a logic operation. Programmable devices also include a number of functional blocks having specialized logic devices adapted to specific logic operations, such as adders, multiply and accumulate circuits, phase-locked loops (PLL), and memory. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

PLDs utilize internal and external clock signals for operation. For example, a FPGA may accept an internal or external "reference" clock signal that is then used to synchronize the operation of the internal FPGA circuitry. As integrated circuits shrink, and clock speeds increase, providing a clock signal capable of synchronization the circuitry of a PLD becomes increasingly problematic. Propagation delays due to internal buffering and interconnection routing causes the clock signal to become skewed leading to an increase in PLD operational errors.

Some circuit elements of the PLD, such as combinational logic, may be employed to statically delay clock signals. The static delay is used to adjust the phase of the clock signal from an input location to an output location on the PLD. The static delay is used to align the phase between the output clock signal and the reference clock signal. Unfortunately, such static delay may dramatically change over the PLD operating range eliciting operational errors, and using such circuit elements wastes valuable PLD resources.

There is therefore a need for circuits and methods to provide a simple and cost effective circuit that provides an adjustable phase output for one or more output clock signals.

BRIEF SUMMARY

Embodiments of the present invention pertain to techniques and circuitry used to generate a plurality of output clock signals having discrete phase shift ranges relative to a reference clock signal. An adjustable delay line is used to generate the plurality of output clock signals from the reference clock signal. Each of the output clock signals may be part of an individual delay-locked loop (DLL) that includes the adjustable delay line as one element of the loop.

In one embodiment, respective phase correction circuits are selectively coupled to the output clock signals to monitor a phase relationship between the reference clock signal and a selected one of the output clock signals. The respective phase correction circuits generate an error signal in response to the phase difference between the reference clock signal and the selected output clock signal. The error signal is used to adjust the adjustable delay line until the reference clock signal and the selected clock signal are phase locked.

A better understanding of the nature and advantages of the present invention can be gained from the following detailed description and the accompanying drawings.

BRIEF DESCRIPTION OF THE DRAWINGS

FIG. 8 is a flow diagram of one embodiment of a method of generating a plurality of output signals individually phase lockable with, and derived from a common reference signal, in accordance with embodiments of the invention.

These and other embodiments of the invention are described in further detail below.

DESCRIPTION OF EXEMPLARY EMBODIMENTS

Embodiments of the invention are directed to delay-locked loop (DLL) circuits used, for example, to generate clock signals having variable phase shift ranges relative to a reference signal. Generally, the clock signals are used for the operation of a programmable logic device (PLD) such as field programmable gate arrays (FPGA). As described herein, a clock signal is generally referred to as a periodic signal or timing signal used for the operation of digital circuitry such as the PLD. For clarity, with respect to the DLLs described herein, the time delay between the input and output clock signals is described in terms of a phase shift between rising or falling edges of digital clock signals having the same frequency. However, one skilled in the art will appreciate that embodiments of the invention may be applied to other types of signals, including analog signals, signals that differ in frequency, etc.

Figure 1:
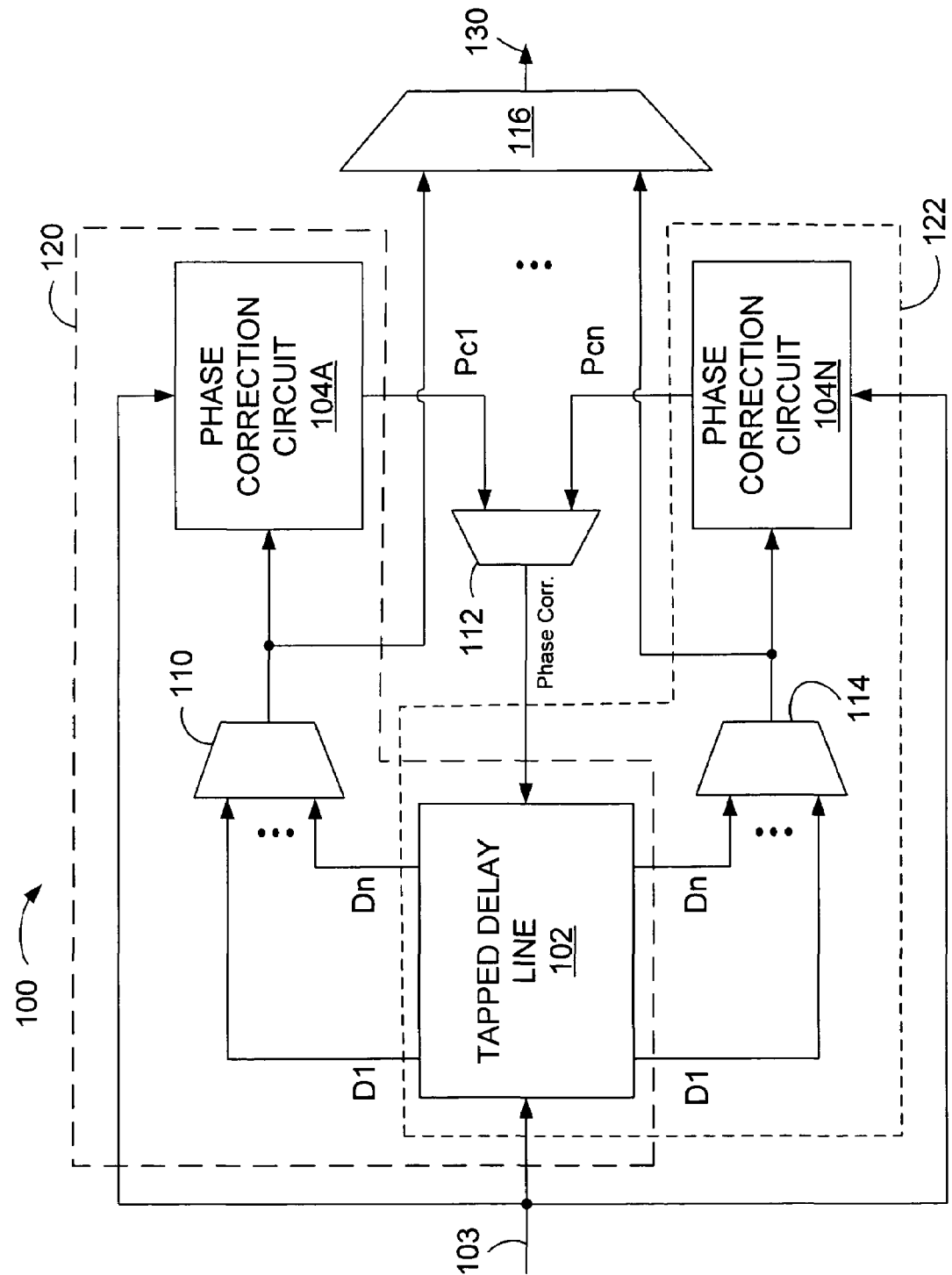
FIG. 1 illustrates a simplified schematic view of one embodiment of an enhanced digital delay-locked loop circuit in accordance with embodiments of the invention.

FIG. 1 illustrates a simplified schematic view of one embodiment of an enhanced digital delay-locked loop circuit 100. The enhanced digital delay-locked loop circuit 100 includes a delay line 102, a first phase comparison circuit 104A, a second phase comparison circuit 104N, and an output multiplexer circuit 116. Herein, N is indicative of an "Nth" number. The delay line 102 may be a tapped delay line, an adjustable delay line with a selectable phase output, and the like, or a plurality of discrete adjustable delay lines. In one embodiment, the delay line 102 is capable of generating a plurality of output clock signals D1-DN described further herein in response to a reference clock signal 103 coupled thereto.

The output clock signals D1-DN are selectively fed from the delay line 102 to the first and second phase correction circuits 104A and 104B. The first and second phase correction circuits 104A and 104B are configured to compare the phase difference between and input reference signal 103 and a selected output clock signal D1-DN. The first and second phase correction circuit 104A-B may include one or more phase detectors, mixers, oscillators, dividers, and other circuits needed to form phase correction circuits such as phase-locked loops (PLL), DLLs, and the like, that are capable of adjusting the phase between the reference clock signal 103 and the selected output clock signal.

In one embodiment, the first and second phase correction circuits 104A and 104B generate an error signal Pc1-PcN in response to the phase difference between the reference signal 103 and the selected output clock signal D1-DN. A selected one of the error signals Pc1-PcN is fed back to the delay line 102 via a multiplexer circuit 112. The selected error signal Pc1-PcN is configured to adjust the delay line 102 until the reference signal 103 and the selected output clock signal D1-DN are in phase.

In one embodiment, the delay line 102 and the first phase correction circuit 104A form DLL 120, and the delay line 102 and the second phase correction circuit 104B form DLL 122. For clarity, only two DLLs are shown (e.g., DLL 120 and 122). However, one skilled in the art will appreciate that any number of individual DLLs may be formed with respect to the number of output clock signals D1-DN. To form DLL loop 120, one of the output clock signals D1-DN is coupled through a multiplexer circuit 110 to an input of the phase correction circuit 104A. One of the error signals Pc1-PcN is coupled from the phase correction circuit 104A to an input of the delay line 102 for adjustment thereof. To form DLL 122, one of the output clock signals D1-DN is coupled through a multiplexer circuit 114 to an input of the phase correction circuit 104N. One of the error signals Pc1-PcN is coupled from the phase correction circuit 104N to an input of the delay line 102 for adjustment thereof. An output multiplexer circuit 116 progammably couples the selected output clock signal D1-DN from multiplexer 110 or multiplexer 114 to generate output signal 130.

Figure 2:
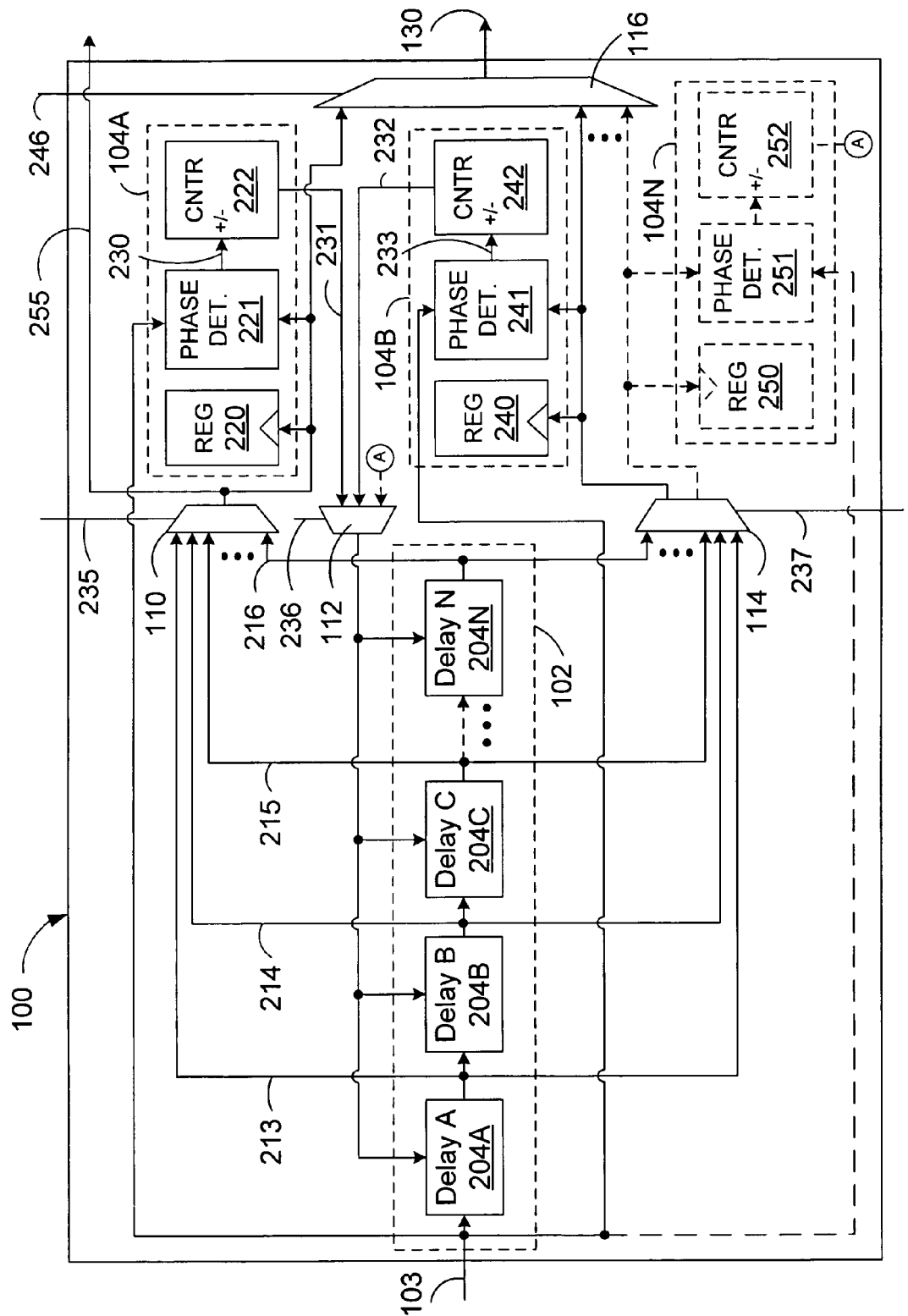
FIG. 2 illustrates a more detailed schematic view of one embodiment of the enhanced digital delay-locked loop circuit of FIG. 1, in accordance with embodiments of the invention.

FIG. 2 illustrates a more detailed schematic view of one embodiment of the enhanced digital delay-locked loop circuit 100 of FIG. 1. In one embodiment, the output signals 213-216 (e.g., D1-DN) are each generated with a predetermined amount of delay provided by the delay line 102. For example, the delay line 102 includes one or more delay elements 204A-N (e.g., delay cells), such as flip-flops, inverters, and other circuits capable of generating output clock signals 213-216 in response to a reference clock signal 103 coupled thereto. The output clock signals 213-216 are delayed in phase from the reference clock signal 103 with respect to the amount of delay generated by each of the delay elements 204A-N that are part of a respective output clock signal path. For example, output clock signal 213 includes delay element 204A (e.g. delay element A). Therefore, the amount of phase shift between the reference clock signal 103 and the output clock signal 213 includes the phase shift generated by delay element 204A. Similarly, the amount of phase shift between the reference clock signal 103 and the output clock signal 214 includes the phase shift generated by delay element 104A plus the phase shift of delay element 204B (e.g. delay element B).

In one configuration, each delay element 104A-B provides about an equal amount of phase shift, however, it is contemplated that each delay element 104A-B may provide differing delay amounts. In one example, consider the case where there are ten delay elements 204A-N. Each delay element 204A-N provides about 0° to about +36° or −36° of phase shift relative to the phase of the reference clock signal 103 at the input of the delay line 102. For example, when each of the ten delay elements 204A-N is set to about +36° of phase shift, the total summation of phase shift would be 360° between the reference clock signal 103 and the Nth output clock signal 216. While only four delay elements 204A-N are illustrated in FIG. 2, it is contemplated that any number of delay elements 204A-N may be used to advantage. For example, twelve delay elements 104A-N may be used, each with 30° of phase shift.

In one embodiment, multiplexer circuit 110 is used to selectively apply one of the output clock signals 213-216 to the first phase correction circuit 104A, and multiplexer circuit 114 may be used to selectively apply one of the output clock signal 213-216 to the second phase correction circuit 104B. It is contemplated that multiplexer circuit 110 and multiplexer circuit 114 may be programmably controlled to select which of the output clock signals 213-216 may be input to the first phase correction circuit 104A and the second phase correction circuit 104B. For example, the multiplexer circuit 114 may be controlled by a processor portion of a PLD operating selection signal 235 of multiplexer circuit 110. Similarly, the multiplexer circuit 114 may be controlled by a processor portion of a PLD operating a selection signal 237 of multiplexer circuit 114. While shown separately, in another embodiment, multiplexer circuit 110 and multiplexer circuit 114 may be combined into a single multiplexer circuit having multiple inputs and outputs.

In one embodiment, the first phase correction circuit 104A includes an optional first register 220, a first phase detector 221, and a first counter circuit 222, and the second phase correction circuit 104B includes an optional second register 240, a second phase detector 241, and a second counter circuit 242. In response to a rising and/or falling edge of the selected output clock signal 213-216, the first register 220 and/or second register 240 may store or write data from data buses (not shown). For example, as described further below with respect to FIG. 5, register 220 and 240 may represent input/output (IO) registers of a PLD.

The first phase detector 221 includes an input coupled to the reference clock signal 103. The first phase detector 221 is selectively coupled on another input, via an output of the multiplexer circuit 110, to one of the output clock signals 213-216. The first phase detector 221 is configured to generate a first error signal 230 in response to the phase difference between the reference clock signal 103 and the selected one of the output clock signals 213-216. The first error signal 230 is used to increment or decrement the first counter circuit 222. For example, the first counter circuit 222 generates a first control signal 231 which increments or decrements in count value in response to the first error signal 230 (e.g., counts up or down).

The second phase detector 125 includes an input coupled to the reference clock signal 103. The second phase detector 125 is selectively coupled on another input, via an output of the multiplexer circuit 114, to one of the output clock signals 213-216. The second phase detector 241 is configured to generate a second error signal 233 in response to the phase difference between the reference clock signal 103 and the selected one of the output clock signals 213-216. The second error signal 233 is used to increment or decrement the second counter circuit 242. For example, the second counter circuit 242 generates a second control signal 232 in response to the second error signal 133.

In one embodiment, the first or second error signal 231 or 232 may be used to dynamically adjust the adjustable delay line 102 and therefore dynamically adjust the phase shift of the selected output clock signal 213-216. In this embodiment, error signal 231 or 232 are configured to adjust the delay line 102 to maintain a phase relationship between the reference clock signal 103 and the selected output clock signal 213-216. For example, each of the delay elements 204A though 204N may be dynamically adjusted between a minimum and a maximum phase shift. In one embodiment, the adjustable delay line 102 provides about a +/−360° phase shift, or more, between rising or falling edges of the reference clock signal 103 and the output clock signal 213-216 to maintain phase therebetween.

Illustratively, with regard to the first phase correction circuit 104A, when the first phase detector 222 detects that the selected output signal 213-216 lags the reference clock signal 103, e.g., there is too much delay, the first error signal 230 causes the first counter circuit 222 to decrement, e.g., count down, to generate a decrementing count value of the first control signal 231. Subsequently, the phase shift of the delay line 102 is reduced in response to the decrementing value of the first control signal 231, decreasing the phase difference between the selected output signal 213-216 and the reference clock signal 103. Conversely, when the first phase detector 221 detects that the selected output signal 213-216 is leading the reference clock signal 103, e.g., there is not enough delay, the first error signal 130 causes the first counter circuit 123 to increment, e.g., count up, to generate an incrementing value of the first control signal 131. The phase shift of the delay circuit 102 is increased in response to the incrementing value of the first control signal 231, increasing the phase difference between the selected output signal 213-216 and the reference clock signal 103.

Illustratively, with regard to the second phase correction circuit 104B, when the second phase detector 241 detects that the selected output signal 213-216 lags the reference clock signal 103, e.g., there is too much delay, the second error signal 233 causes the second counter circuit 242 to decrement, e.g., count down, to generate a decrementing value of second control signal 232. The phase shift of the delay circuit 102 is reduced in response to the decrementing value of the second control signal 232, decreasing the phase difference between the selected output signal 213-216 and the reference clock signal 103. Conversely, when the second phase detector 241 detects that the selected output signal 213-216 is leading the reference clock signal 103, e.g., there is too little delay, the second error signal 233 causes the second counter circuit 242 to increment, e.g., count up, to generate an incrementing value of the second control signal 233. Subsequently, the phase shift of the delay circuit 102 is increased in response to the incrementing value of the second control signal 232, increasing the phase difference between the selected output signal 213-216 and the reference clock signal 103. While the above describes incrementing and decrementing the phase of the delay circuit 102 in response to an incrementing and decrementing value, it is to be understood that the reverse may be used, e.g., a decrementing value of the error signals 231 and/or 232 may be used to increase the phase shift of the delay circuit 102.

In another embodiment, the one or more delay elements 104A-N may be selected to provide a coarse phase control and a fine phase control to close each of the respective DLL feedback loops (e.g., DLL loops 120 and 122). In one operational example, delay elements 204A and 204B, may be fixed with a phase shift value to provide a coarse phase control, and delay element 204C may be used to provide the fine phase control. For example, if the delay elements 204A-N each contributed from zero to about 10° phase shift, and a phase shift of 27° was required, delay element 204A plus delay element B may be used to provide the coarse phase control of 10° each, or 20° together, and delay element 204C may be used to provide the fine phase control of around 7° to maintain the phase shift of about 27° using the respective error signal 231 or error signal 232.

The enhanced digital delay-locked loop circuit 100 is capable of outputting the output signals 213-216 to other circuits either individually, for example, via output signal 255, or through multiplexer circuit 116. Multiplexer circuit 116 is capable of coupling one or more output clock signals 213-216 to external circuits (not shown) as output clock signal 130. In one embodiment, multiplexer circuit 116 may be programmatically controlled by PLD circuitry via selection signal 246. For example, one of the output clock signals 113-116 may be selected by selection signal 246 and coupled to an external circuit via output clock signal 130.

Figure 3:
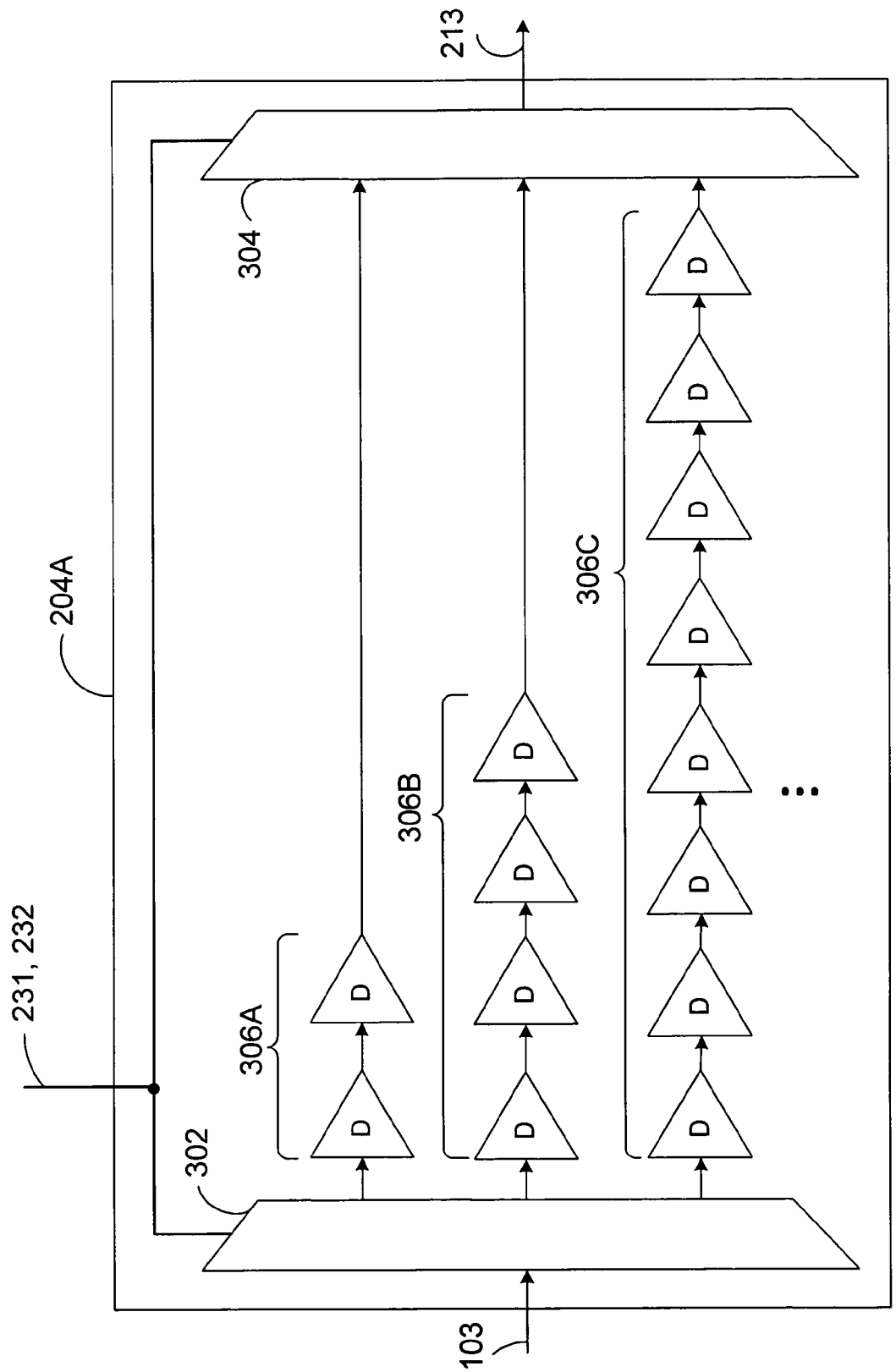
FIG. 3 illustrates a simplified schematic diagram of an adjustable delay element in accordance with embodiments of the invention.

FIG. 3 illustrates a simplified schematic diagram of an adjustable delay element 204A-N. In one embodiment, the adjustable delay element 204A-N includes an input multiplexer circuit 302 having an input coupled to reference clock signal 103 and outputs coupled to a plurality of digital delay circuits 306A-C. The digital delay circuits 306A-C are coupled on respective outputs to respective inputs of an output multiplexer circuit 304. The digital delay circuits 306A-C include one or more delay elements such as flip-flops, comparators, and the like, capable of providing an incremental phase shift of reference clock signal 103. While digital circuits are illustrated, those skilled in the art will appreciate that adjustable delay element 204A-N may be formed of any combination of analog or digital circuit elements including resistors, capacitors, diodes, transistors, etc.

In one embodiment, the resolution of the delay element 204A-N is proportional to the number of delay circuits 306A-C available. In this illustration, the delay resolution may be considered to be 4-bit as the number of delay circuits 306A-C paths is four. For example, a logic value of "00" may be used to establish no delay, a logic value of "01" may be used to select delay circuit 306A, a logic value of "10" may be used to select delay circuit 306B, and a logic value of "11" may be used to select delay circuit 306C. Illustratively, in response to such logic values, each delay circuit 306A-C provides an incremental increase in phase shift. For example, delay circuit 306A provides delay of D, delay circuit 306B provides delay of 2×D, delay circuit 306C provides delay 3×D, and so forth.

In one operational configuration, the input and output multiplexer circuit 302 and 304 are dynamically controlled by error signal 231 or 232. For example, during operation the error signal 231,232 may dynamically select delay circuit 306A, 306B, or 306C, depending on the value of error signal 231, 232 (e.g., count value "01").

Figure 4:
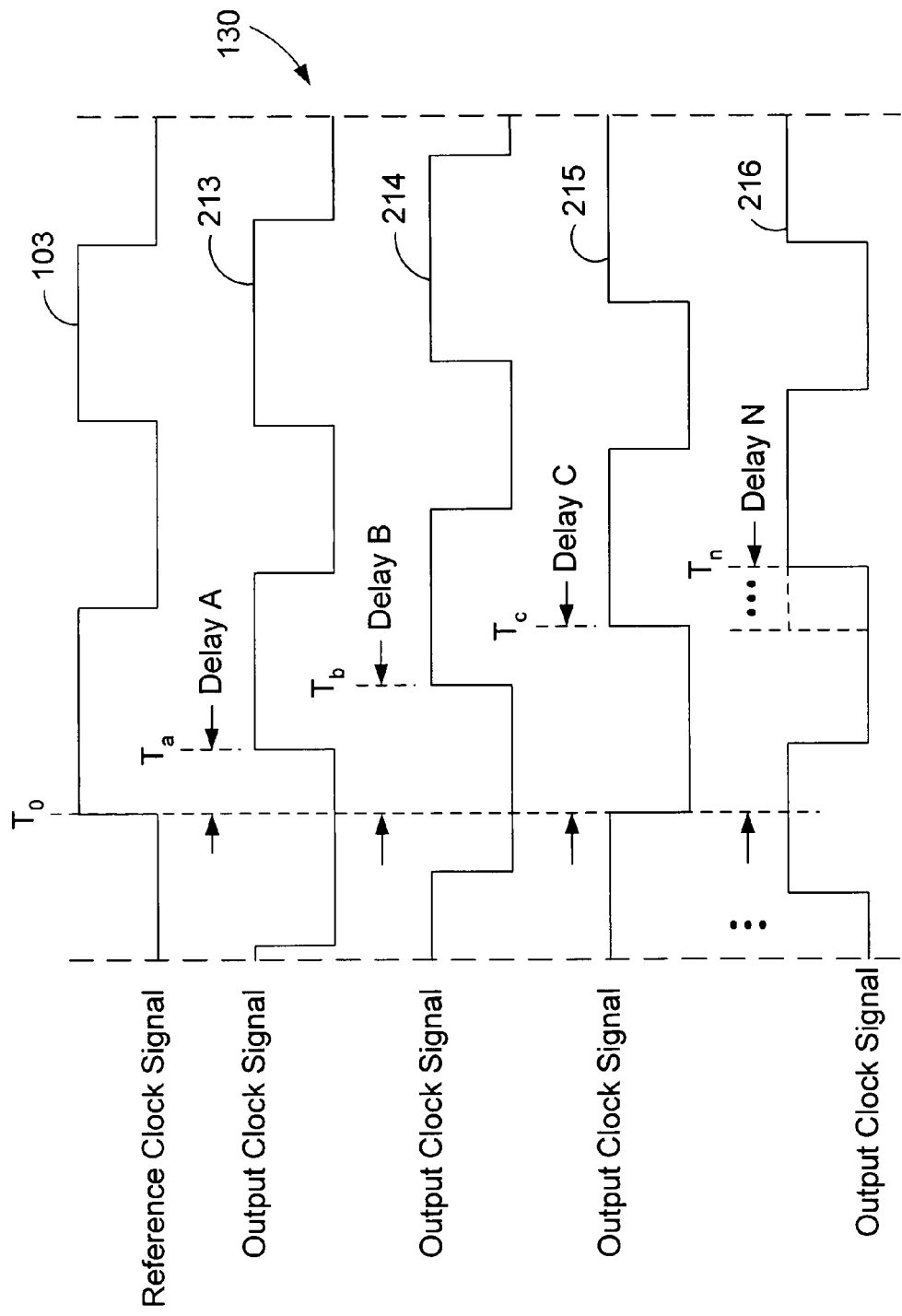
FIG. 4 illustrates a timing diagram of one embodiment of an enhanced digital delay-locked loop circuit in accordance with embodiments of the invention.

Illustratively, FIG. 4 shows the output clock signal 113 delayed a value of $T_a$ relative an input clock measurement of $T_0$. Similarly, as illustrated, the output clock signal 114 is delayed a value of $T_b$, the output clock signal 115 is delayed a value of $T_c$, and the output clock signal 116 is delayed a value of $T_n$. While a positive delay value is shown whereby the reference clock signal 103 leads the output clock signals 213-216, due to signal propagation, the reverse may be true. For example, an output clock signal 213-216 having a delay equal to a phase shift greater than 360° but less than 720° may be considered leading the reference clock signal 103.

Figure 5:
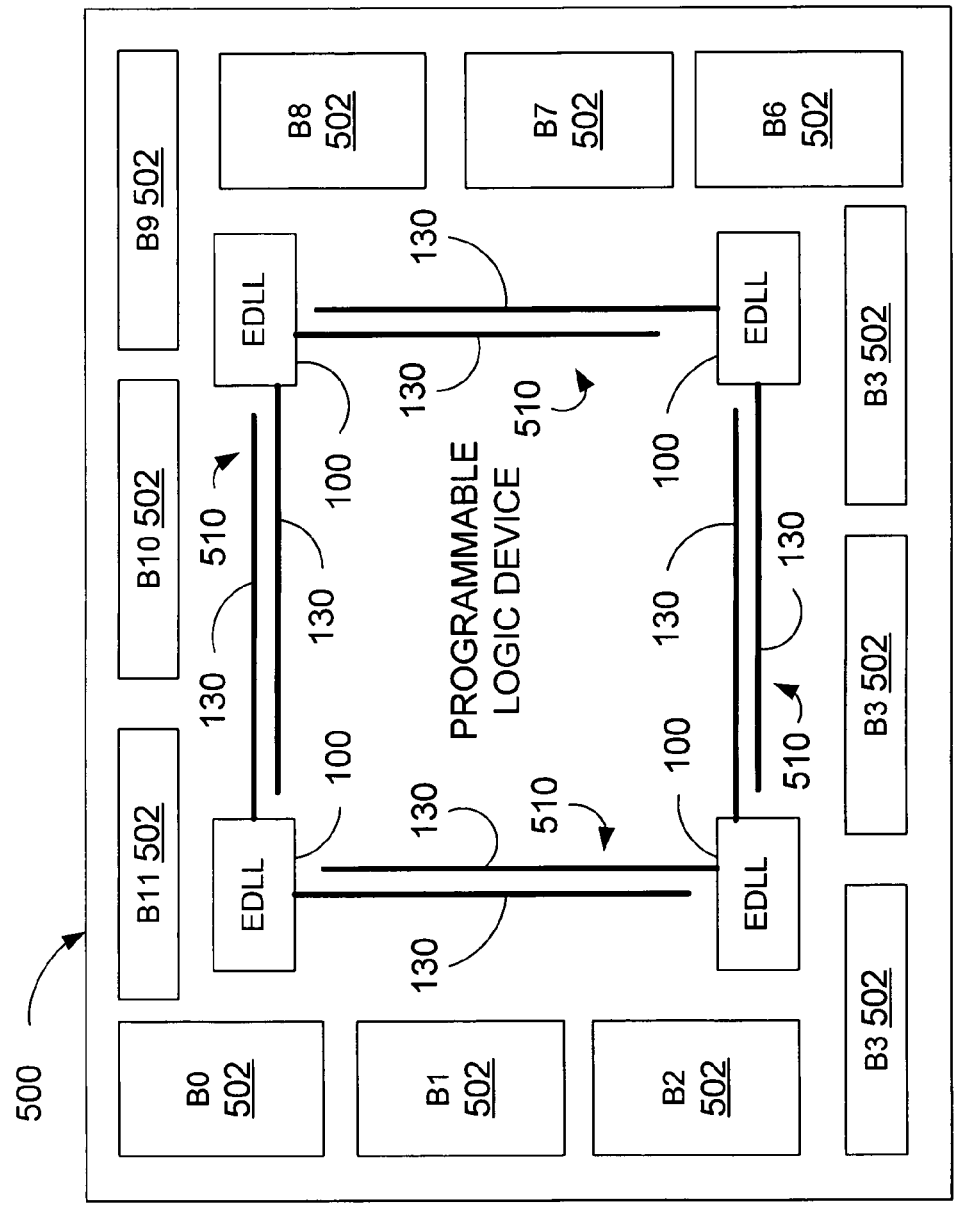
FIG. 5 illustrates a schematic view of one embodiment of programmable device having a plurality of enhanced digital delay-locked loop circuits in accordance with embodiments of the invention.

FIG. 5 illustrates a schematic view of one embodiment of a PLD 500 having a plurality of enhanced digital delay-locked loop circuits 100. Virtually any number of enhanced digital delay-locked loop circuits 100 may be used to advantage to provide output signals 213-216 to different regions of the PLD 500. For example, as illustrated in FIG. 5, four enhanced digital delay-locked loop circuits 100 may be located in four quadrants of the PLD 500. The output clock signal 130 may be disposed accordingly to accommodate one or more input/output (IO) registers 502. For example, as illustrated, the output clock signals 130 may be transmitted via one or more buses 510 that extend along two adjacent sides of the PLD 300. The buses 510 may be configured to accommodate a plurality of IO registers 502 representing for example, a single IO interface of a particular bit width, e.g., 72 bits, 144 bits, 256 bits, etc. Advantageously, as the delay amount of the output clock signals 130 may be programmatically adjusted by the PLD 500 to accommodate a variety of input clock signal delays, each of the enhanced digital delay-locked loop circuits 100 may be configured to accommodate a phase shift range required for one particular circuit configuration of the PLD 500, and then programmatically changed to accommodate a different delay requirement for another PLD configuration. One skilled in the art will appreciate that other modifications may be made to this circuitry consistent with the present invention.

Figure 6:
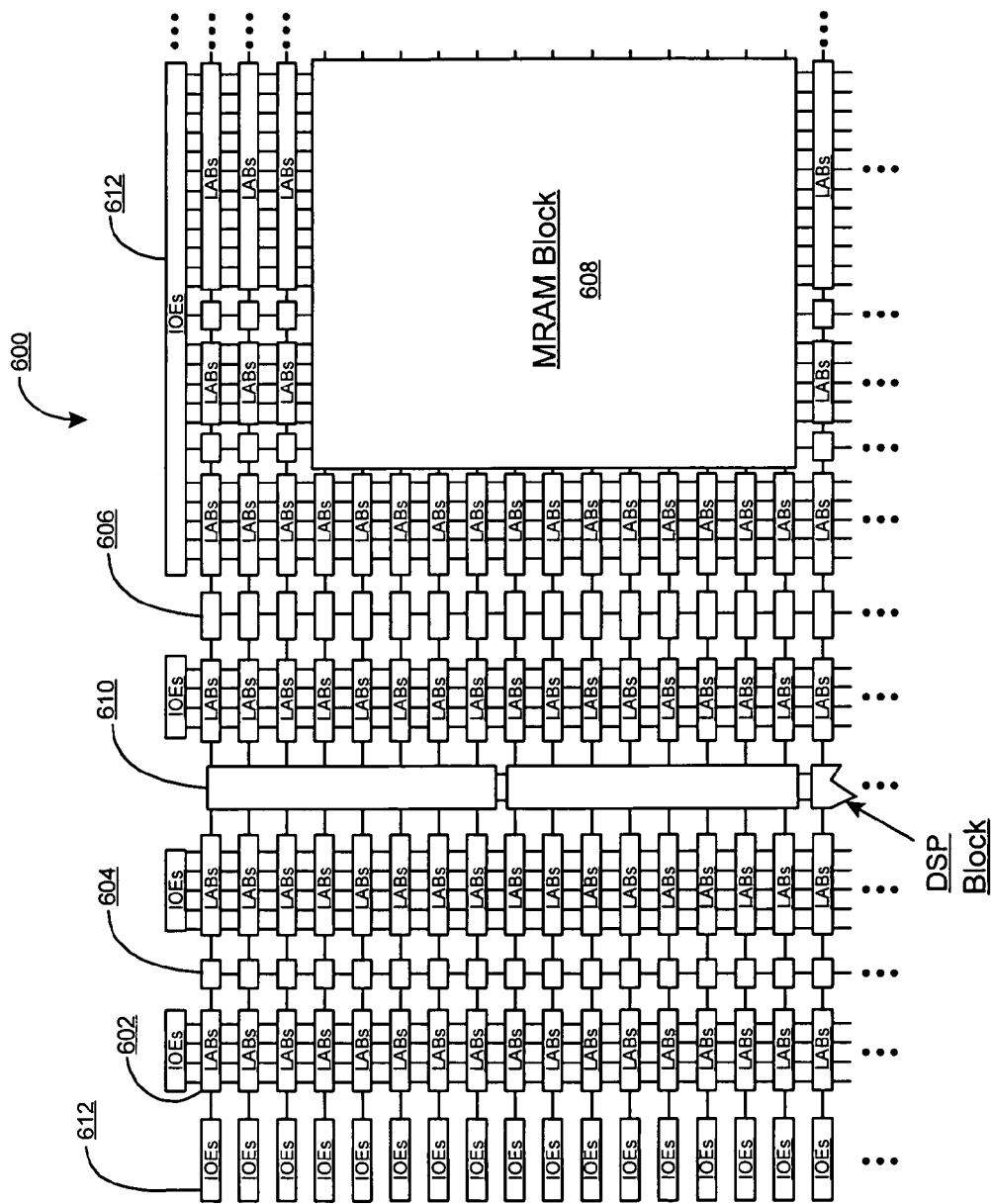
FIG. 6 is a simplified block diagram of a programmable logic device that can embody the techniques of the present invention.

FIG. 6 is a simplified partial block diagram of one example of PLD 500 that can include aspects of the present invention. It should be understood that the present invention can be applied to numerous types of integrated circuits including programmable logic integrated circuits, field programmable gate arrays, mask FPGAs, and application specific integrated circuits (ASICs). PLD 500 is an example of a programmable logic integrated circuit in which techniques of the present invention can be implemented. PLD 500 includes a two-dimensional array of programmable logic array blocks (or LABs) 602 that are interconnected by a network of column and row interconnects of varying length and speed. LABs 602 include multiple (e.g., 10) logic elements (or LEs).

An LE is a programmable logic block that provides for efficient implementation of user defined logic functions. A PLD has numerous logic elements that can be configured to implement various combinatorial and sequential functions. The logic elements have access to a programmable interconnect structure. The programmable interconnect structure can be programmed to interconnect the logic elements in almost any desired configuration.

PLD 500 also includes a distributed memory structure including RAM blocks of varying sizes provided throughout the array. The RAM blocks include, for example, 512 bit blocks 604, 4K blocks 606, and a block 608 providing 512K bits of RAM. These memory blocks can also include shift registers and FIFO buffers.

PLD 500 further includes digital signal processing (DSP) blocks 610 that can implement, for example, multipliers with add or subtract features. I/O elements (IOEs) 612 located, in this example, around the periphery of the device support numerous single-ended and differential I/O standards. It is to be understood that PLD 500 is described herein for illustrative purposes only and that the present invention can be implemented in many different types of PLDs, FPGAs, and the like.

Figure 7:
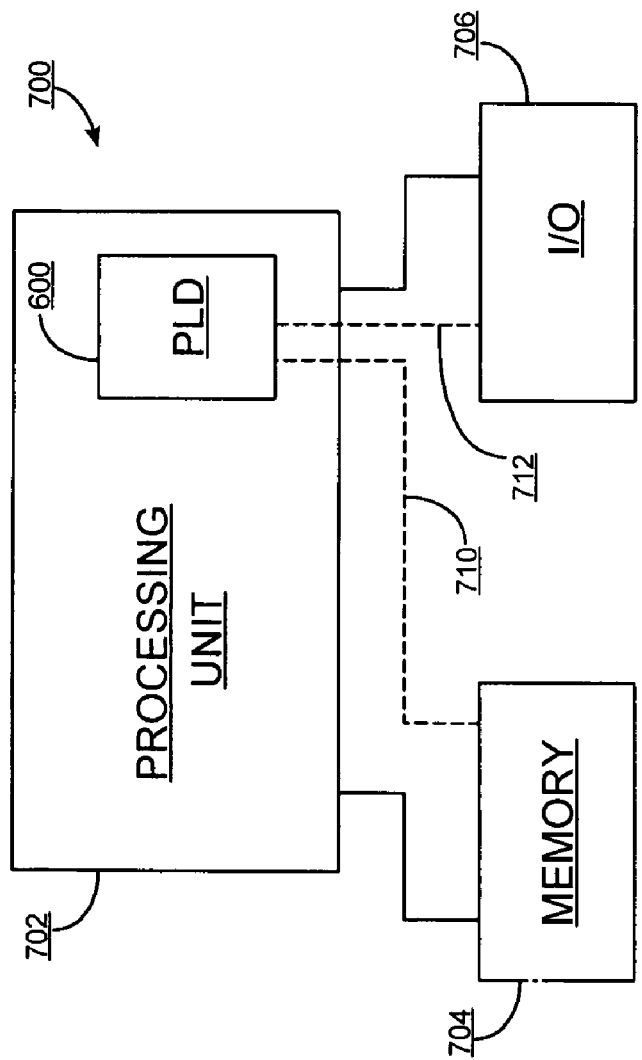
FIG. 7 is a block diagram of an electronic system that can implement embodiments of the present invention.

While PLDs 500 of the type shown in FIG. 5 and FIG. 6 provide many of the resources required to implement system level solutions, the present invention can also benefit systems wherein a PLD is one of several components. FIG. 7 shows a block diagram of an exemplary digital system 700, within which the present invention can be embodied. System 700 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 700 can be provided on a single board, on multiple boards, or within multiple enclosures.

System 700 includes a processing unit 702, a memory unit 704 and an I/O unit 706 interconnected together by one or more buses. According to this exemplary embodiment, a programmable logic device (PLD) 700 is embedded in processing unit 702. PLD 700 can serve many different purposes within the system in FIG. 7. PLD 700 can, for example, be a logical building block of processing unit 702, supporting its internal and external operations. PLD 500 is programmed to implement the logical functions necessary to carry on its particular role in system operation. PLD 700 can be specially coupled to memory 704 through connection 710 and to I/O unit 706 through connection 712.

Processing unit 702 can direct data to an appropriate system component for processing or storage, execute a program stored in memory 704 or receive and transmit data via I/O unit 706, or other similar function. Processing unit 702 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 700 can control the logical operations of the system. In an embodiment, PLD 700 acts as a reconfigurable processor, which can be reprogrammed as needed to handle a particular computing task. Alternately, programmable logic device 708 can itself include an embedded microprocessor. Memory unit 704 can be a random access memory (RAM), read only memory (ROM), fixed or flexible disk media, PC Card flash disk memory, tape, or any other storage means, or any combination of these storage means.

FIG. 8 is a flow diagram of one embodiment of a method 800 of generating a plurality of output clock signals 213-216 individually derived from a reference clock signal 103. The method 800 is entered into when, for example, a portion of a PLD (e.g., PLD 500) is programmed to output a plurality of clock signals 213-216 from a reference clock signal 103. At step 802, a determination is made for the amount of coarse phase shift needed for the output clock signal 213-216 to accommodate a particular phase shift required for clock signals 213-216 to be within a phase lock capture range of the reference clock signal 103. For example, a measurement device such as an Oscilloscope may be used to determine the amount of coarse delay needed to adjust the phase of the clock signals on one output location of the PLD bus within a capture range of a DLL (e.g., DLLs 120 or 122). At step 804, the method 800 uses a delay line 102 to generate a plurality of output clock signals 213-216. At step 806, the delay line 102 is configured with a coarse delay that about matches the phase shift determined from step 802. At step 808, a DLL is used to phase lock the output reference signal 130 to the input reference signal 103. Method 800 ends at step 810.

The foregoing description of specific embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A programmable logic device comprising:
   a first digital delay-locked loop to receive an input clock signal from a digital delay chain and generate a first output clock signal having a first phase shift amount in response to a phase relationship between the first output clock signal and the input clock signal;
   a second digital delay-locked loop to receive the input clock signal from the digital delay chain and generate a second output clock signal having a second phase shift amount in response to a phase relationship between the second output clock signal and the input clock signal; and
   a signal selection circuit to selectively output the first output clock or the second output clock in response to a requirement for the first phase shift amount or the second phase shift amount.

2. The programmable logic device of claim 1, wherein the first digital delay-locked loop comprises a phase comparator and a counter, wherein the phase comparator provides an error signal to the counter in response to a phase difference between the input clock signal and the first output clock signal.

3. The programmable logic device of claim 2, wherein the counter adjusts a delay value of the digital delay chain in response to the error signal.

4. The programmable logic device of claim 1, wherein the second digital delay-locked loop comprises a phase comparator and a counter, wherein the phase comparator provides an error signal to the counter in response to a phase difference between the input clock signal and the second output clock signal.

5. The programmable logic device of claim 4, wherein the counter adjusts a delay value of the digital delay chain in response to the error signal.

6. The programmable logic device of claim 1, wherein the digital delay chain comprises a plurality of delay elements responsive to an error signal generated by the first digital delay-locked loop circuit in response to the phase difference between the first output clock signal and the input clock signal.

7. The programmable logic device of claim 1, wherein the digital delay chain comprises a plurality of delay elements responsive to an error signal generated by the second digital delay-locked loop circuit in response to the phase difference between the second output clock signal and the input clock signal.

8. The programmable logic device of claim 1, wherein the signal selection circuit comprises a switching circuit to selectively output the first output clock signal and the second output clock signal.

9. A delay-locked loop circuit comprising:
   a digital delay line circuit to generate in response to an input clock signal, at least first and second output clock signals from the input clock signal;
   a first phase comparison circuit to generate a first error signal in response to a first phase difference between the first output clock signal and the input clock signal, wherein the digital delay line circuit adjusts the phase between the first output clock signal and the input clock signal in response to the first error signal;
   a second phase comparison circuit to generate a second error signal in response to a second phase difference between the second output clock signal and the input clock signal, wherein the digital delay line circuit is adjusts the phase between the second output clock signal and the input clock signal in response to the second error signal; and
   a clock signal selection circuit to provide the first output clock signal or the second output clock signal to one or more circuits in response to a selection of the first output clock signal or the second output clock signal.

10. The delay-locked loop circuit of claim 9, wherein the digital delay line comprises one or more delay elements.

11. The delay-locked loop circuit of claim 10, wherein the delay elements are adjustable within a predetermined phase shift range.

12. The delay-locked loop circuit of claim 9, wherein the first phase comparison circuit comprises a first phase comparator to generate a phase error signal in response to a phase difference between the input clock signal and one of the output clock signals.

13. The delay-locked loop circuit of claim 12, wherein the first phase comparison circuit comprises a counter circuit, wherein the counter circuit generates the first error signal in response to the phase error signal received from the first phase comparator.

14. The delay-locked loop circuit of claim 9, wherein the second phase comparison circuit comprises a second phase comparator to generate a phase error signal in response to a phase difference between the input clock signal and one of the output clock signals.

15. The delay-locked loop circuit of claim 14, wherein the second phase comparison circuit comprises a counter circuit, wherein the counter circuit generates the second error signal in response to the phase error signal received from the second phase comparator.

16. A method comprising:
    receiving an input clock signal by a digital delay line;
    generating, from the digital delay line, one or more output clock signals from the input clock signal;
    generating, with a first phase comparison circuit, a first error signal corresponding to a phase difference between the input clock signal and a first of the one or more output clock signals;
    adjusting the first of the output clock signals with the digital delay line in response to the first error signal until the phase difference between the input clock signal and the first of the one or more output clock signals is within a first phase difference range;
    generating, with a second phase comparison circuit, a second error signal corresponding to a phase difference between the input clock signal and a second of the one or more output clock signals;
    adjusting the second of the output clock signals with the digital delay line in response to the second error signal until the phase difference between the input clock signal and the second of the one or more output clock signals is within a second phase difference range; and
    selecting the first of the output clock signals or the second of the output clock signals.

17. The method of claim 16, wherein the digital delay line comprises a plurality of delay elements, wherein each delay element is provides a delayed version of the input clock signal.

18. The method of claim 16, wherein generating the first error signal comprises incrementing a digital output of a counter circuit to adjust the digital delay line to increase or decrease the first phase difference.

19. The method of claim 16, wherein generating the second error signal comprises incrementing a digital output of a counter circuit to adjust the digital delay line to increase or decrease the second phase difference.

20. The method of claim 16, wherein the first of the output clock signals and the second of the output clock signals are the same output signal.

21. The method of claim 16, wherein the first of the output clock signals and the second of the output clock signals are different output signals.

* * * * *